(12) United States Patent
Yu et al.

(10) Patent No.: US 11,056,474 B2
(45) Date of Patent: *Jul. 6, 2021

(54) SEMICONDUCTOR PACKAGE, SEMICONDUCTOR DEVICE AND METHOD OF FORMING THE SAME

(71) Applicant: Taiwan Semiconductor Manufacturing Company, Ltd., Hsinchu (TW)

(72) Inventors: Chen-Hua Yu, Hsinchu (TW); Chung-Shi Liu, Hsinchu (TW); Chih-Fan Huang, Kaohsiung (TW); Tsai-Tsung Tsai, Taoyuan (TW); Wei-Hung Lin, Xinfeng Township (TW); Ming-Da Cheng, Jhubei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/195,402

(22) Filed: Nov. 19, 2018

(65) Prior Publication Data

US 2019/0088635 A1 Mar. 21, 2019

Related U.S. Application Data

(63) Continuation of application No. 15/373,719, filed on Dec. 9, 2016, now Pat. No. 10,134,717, which is a
(Continued)

(51) Int. Cl.
*H01L 25/18* (2006.01)
*H01L 23/31* (2006.01)
(Continued)

(52) U.S. Cl.
CPC ............ *H01L 25/18* (2013.01); *H01L 21/561* (2013.01); *H01L 23/00* (2013.01); *H01L 23/3114* (2013.01); *H01L 24/19* (2013.01); *H01L 25/0655* (2013.01); *H01L 25/50* (2013.01); *H01L 23/3128* (2013.01); *H01L 2224/12105* (2013.01); *H01L 2224/16227* (2013.01); *H01L 2224/32225* (2013.01); *H01L 2224/48091* (2013.01); *H01L 2224/48095* (2013.01); *H01L 2224/48227* (2013.01); *H01L 2224/48465* (2013.01); *H01L 2224/73204* (2013.01); *H01L 2224/73265* (2013.01); *H01L 2224/73267* (2013.01); *H01L 2924/00* (2013.01); *H01L 2924/00014* (2013.01);
(Continued)

(58) Field of Classification Search
None
See application file for complete search history.

(56) References Cited

U.S. PATENT DOCUMENTS 9,530,762 B2 * 12/2016 Yu ..................... H01L 25/0655
2009/0108440 A1 * 4/2009 Meyer .................... H01L 24/96
257/723
(Continued)

*Primary Examiner* — Xiaoming Liu
(74) *Attorney, Agent, or Firm* — Slater Matsil, LLP

(57) ABSTRACT

According to an exemplary embodiment, a semiconductor package is provided. The semiconductor package includes at least one chip, and at least one component adjacent to the at least one chip, wherein the at least one chip and the at least one component are molded in a same molding body.

20 Claims, 8 Drawing Sheets

Related U.S. Application Data continuation of application No. 14/152,168, filed on Jan. 10, 2014, now Pat. No. 9,530,762.

(51) Int. Cl.
*H01L 21/56* (2006.01)
*H01L 25/00* (2006.01)
*H01L 23/00* (2006.01)
*H01L 25/065* (2006.01)

(52) U.S. Cl.
CPC ............... *H01L 2924/12042* (2013.01); *H01L 2924/181* (2013.01); *H01L 2924/19105* (2013.01)

(56) References Cited

U.S. PATENT DOCUMENTS

| | | | |
|---|---|---|---|
| 2009/0179317 A1 | 7/2009 | Iida et al. | |
| 2010/0184256 A1 | 7/2010 | Chino | |
| 2011/0121449 A1* | 5/2011 | Lin | H01L 24/11 257/737 |
| 2011/0233754 A1* | 9/2011 | Meyer-Berg | H01L 24/80 257/693 |
| 2012/0028411 A1* | 2/2012 | Yu | H01L 21/561 438/107 |
| 2012/0282739 A1* | 11/2012 | Brunschwiler | H01L 24/29 438/127 |
| 2013/0062760 A1* | 3/2013 | Hung | H01L 24/97 257/738 |
| 2013/0161784 A1 | 6/2013 | Jang et al. | |
| 2013/0200524 A1* | 8/2013 | Han | H01L 25/105 257/774 |
| 2014/0246223 A1 | 9/2014 | Lee et al. | |

\* cited by examiner

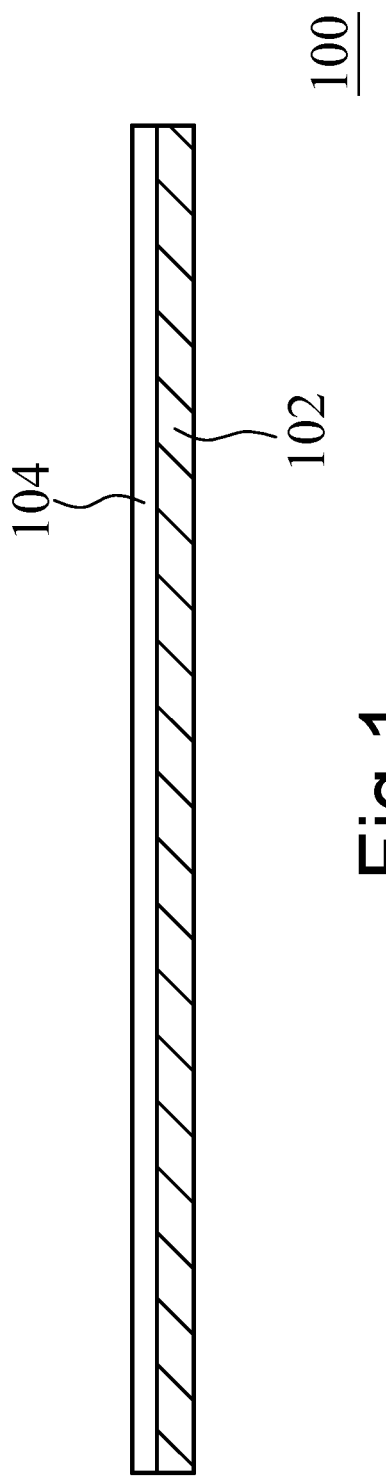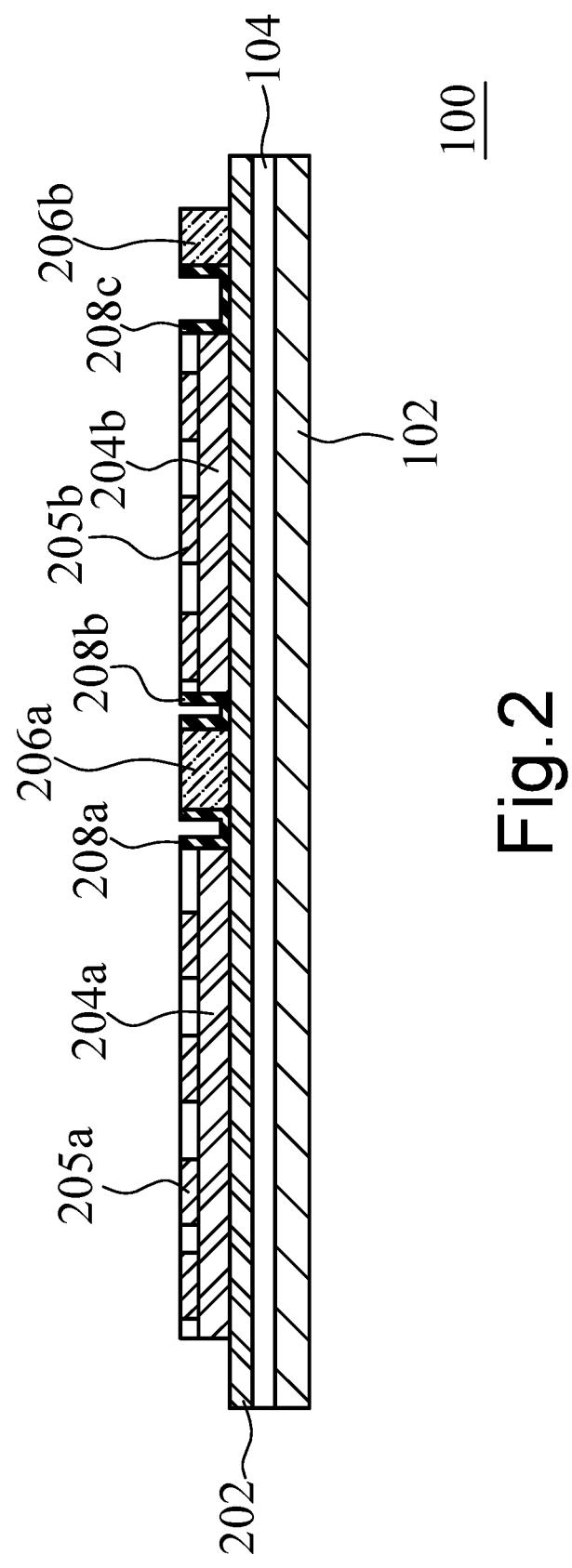

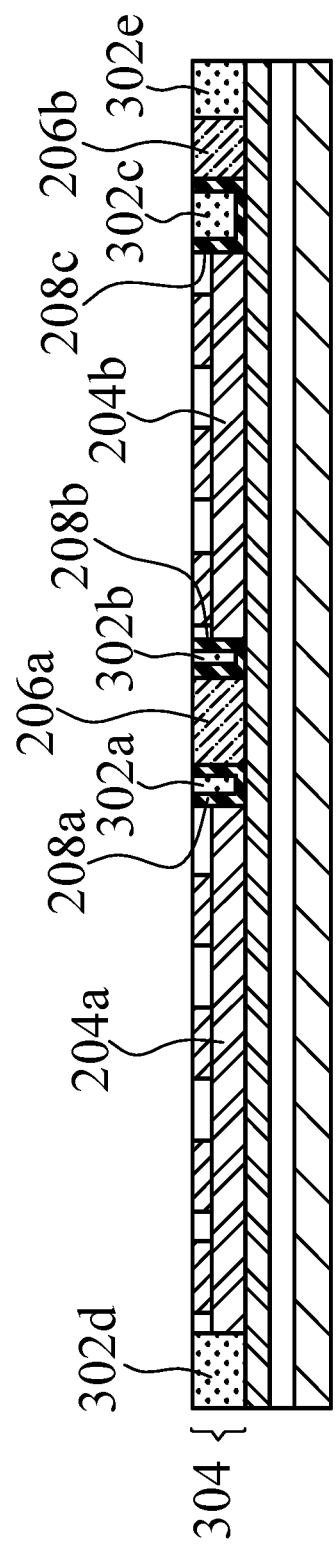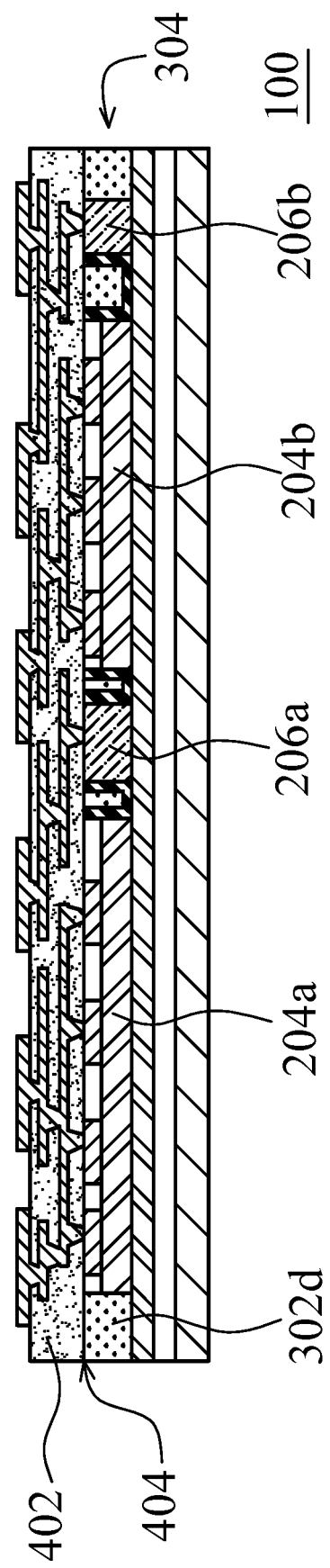

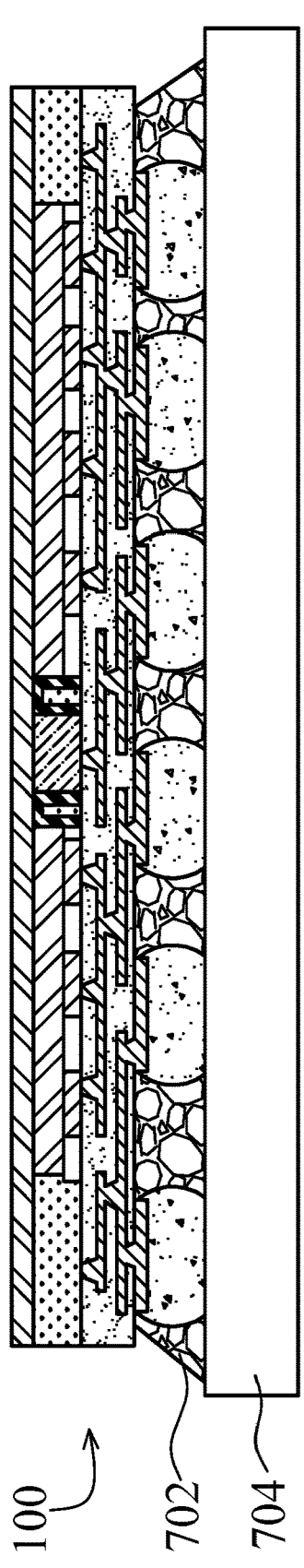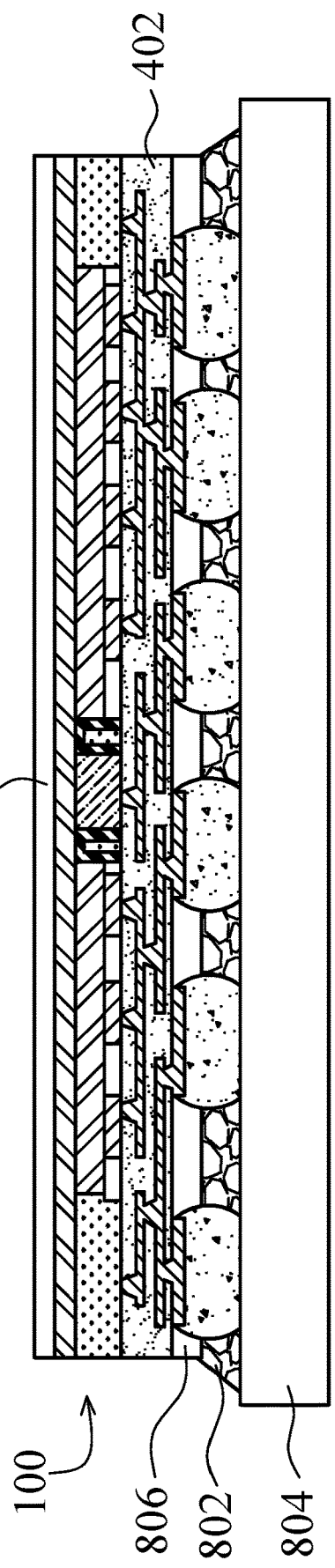

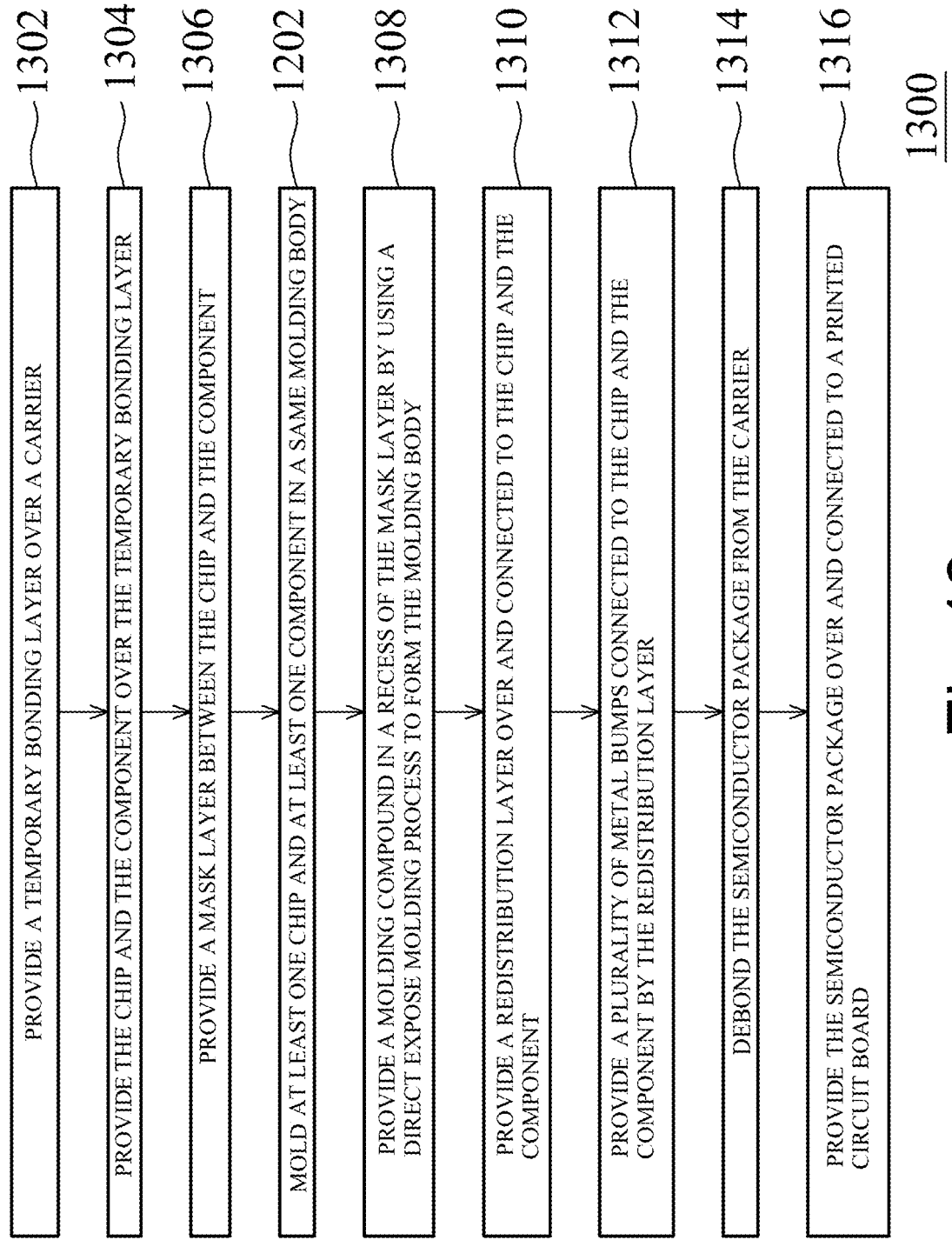

SEMICONDUCTOR PACKAGE, SEMICONDUCTOR DEVICE AND METHOD OF FORMING THE SAME

PRIORITY CLAIM AND CROSS-REFERENCE

This application is a continuation of U.S. patent application Ser. No. 15/373,719, entitled "Semiconductor Package, Semiconductor Device and Method of Forming the Same," filed Dec. 9, 2016, which is a continuation of U.S. patent application Ser. No. 14/152,168, entitled "Semiconductor Package, Semiconductor Device and Method of Forming the Same," filed Jan. 10, 2014 (now U.S. Pat. No. 9,530,762, issued Dec. 27, 2016), which are incorporated herein by reference in its entirety.

BACKGROUND

Passive components and chips are distributed on the printed circuit board and are electrically connected by routings of the printed circuit board. Such connection may induce a large area and thickness overhead. Therefore, there is a need to reduce this overhead.

BRIEF DESCRIPTION OF THE DRAWINGS

FIG. 1 is a sectional view illustrating an exemplary semiconductor package according to an exemplary embodiment.

FIG. 2 is a sectional view illustrating the exemplary semiconductor package according to the exemplary embodiment.

FIG. 3 is a sectional view illustrating the exemplary semiconductor package according to the exemplary embodiment.

FIG. 4 is a sectional view illustrating the exemplary semiconductor package according to the exemplary embodiment.

FIG. 7 is a sectional view illustrating an exemplary semiconductor device according to an exemplary embodiment.

FIG. 8 is another sectional view illustrating an exemplary semiconductor device according to an exemplary embodiment.

FIG. 13 is a flow chart for forming a semiconductor device according to an exemplary embodiment.

DETAILED DESCRIPTION

Figure 5:
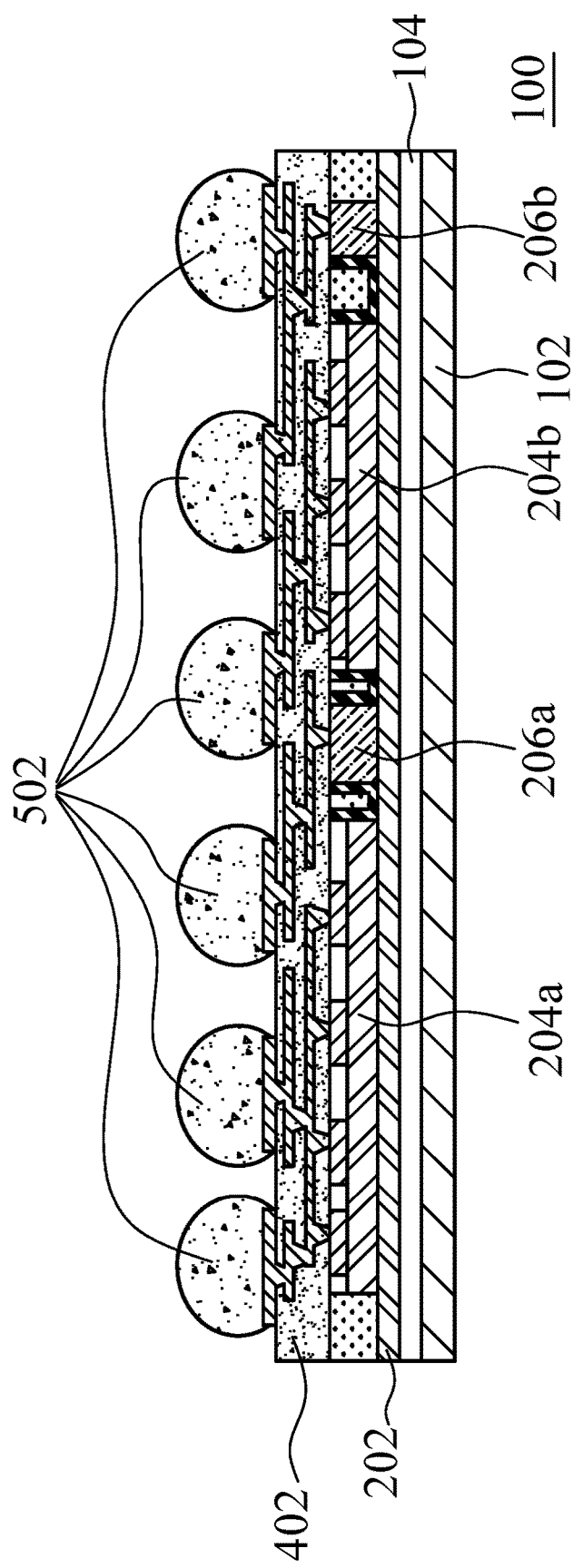
FIG. 5 is a sectional view illustrating the exemplary semiconductor package according to the exemplary embodiment.

Reference will now be made in detail to exemplary embodiments that are illustrated in the accompanying drawings. Wherever possible, the same reference numbers will be used throughout the drawings to refer to the same or like parts.

The disclosure describes a semiconductor package that combines components and chips in the same mold body by using a novel mask layer structure and a direct exposed molding process. The mask layer structure refers to a mask layer disposed between the components and the chips. The direct exposed molding process may refer to a process whereby the components and the chips (or die) are directly exposed after molding, without use of a grinding process.

The direct expose molding process may also refer to a transfer molding process or a compression molding process. Transfer molding or compression molding is a process where the amount of molding material is measured and inserted before the molding takes place. The molding material is preheated and loaded into a chamber known as a pot. A plunger is then used to force the material from the pot through channels, known as a sprue and runner system, into mold cavities. The mold remains closed as the material is inserted and is opened to release the part from the sprue and runner system. The mold walls are heated to a temperature above the melting point of the mold material; this allows a faster flow of material through the cavities.

The chips may be the chip is selected from the group consisting of silicon semiconductors or iii-v semiconductors silicon semiconductors or iii-v semiconductors, and the chips may comprise a microelectromechanical system (MEMS). The components are disposed in a fan-out area of the semiconductor package.

By using the direct exposed molding process, the components and the chips may be integrated in the same layer and molded at the same time. It is noted that the components may be passive components, such as resistor, inductors, or capacitors. Furthermore, components and chips having a similar height may be interconnected by a redistribution layer, reducing yield loss issues due to extra connections between the components and the chips.

FIG. 1 is a sectional view illustrating an exemplary semiconductor package 100 according to an exemplary embodiment. As shown in FIG. 1, a temporary bonding layer 104 is coated over a carrier 102. The carrier 102 may be formed of, for example, metal or glass.

FIG. 2 is a sectional view illustrating the exemplary semiconductor package 100 according to the exemplary embodiment. As shown in FIG. 2, an attach film 202 may be provided over the temporary bonding layer 104. The attach film 202 may be formed of, for example, epoxy or polymer. Chips 204a, 204b and components 206a, 206b are provided over the attach film 202. The chips 204a, 204b respectively include I/Os 205a, 205b. Mask layers 208a, 208b, 208c are provided between the chips 204a, 204b and the components 206a, 206b. The components 206a, 206b may be passive components, such as resistor, inductors or capacitors. The width of the components 206a, 206b may be, for example, 100-500 micrometer. The distance between the chips 204a, 204b and the components 206a, 206b may be, for example, 50-300 micrometer.

FIG. 3 is a sectional view illustrating the exemplary semiconductor package 100 according to the exemplary embodiment. As shown in FIG. 3, molding compounds 302a, 302b, 302c are provided in recesses (or gates) of the mask layers 208a, 208b, 208c by using a direct expose molding process to form the molding body 304. Molding compounds 302d, 302e are provided between different packages. Therefore, the chips 204a, 204b and the components 206a, 206b are molded in the same molding body 304. The mask layers 208a, 208b, 208c may be formed of, for example, polymer. The mask layers 208a, 208b, 208c between the chips 204a, 204b and the components 206a, 206b make molding compounds have a more balanced flow and also enhance recess filling ability.

In the embodiment, the semiconductor package 100 may include the chips 204a, 204b, the components 206a, 206b and the molding compounds 302a-302e. The components 206a, 206b are adjacent to the chips 204a, 204b. The molding compounds 302a-302e are disposed between the chips 204a, 204b and the components 206a, 206b. The chips 204a, 204b, the components 206a, 206b and the molding compounds 302a-302e may form the molding body 304.

FIG. 4 is a sectional view illustrating the exemplary semiconductor package 100 according to the exemplary embodiment. As shown in FIG. 4, a redistribution layer (RDL) 402 is provided over the molding body 304 and connected to the chips 204a, 204b and the components 206a, 206b.

FIG. 5 is a sectional view illustrating the exemplary semiconductor package 100 according to the exemplary embodiment. As shown in FIG. 5, metal bumps 502 are provided over the redistribution layer (RDL) 402, and are connected to the chips 204a, 204b and the components 206a, 206b by the redistribution layer (RDL) 402.

Figure 6:
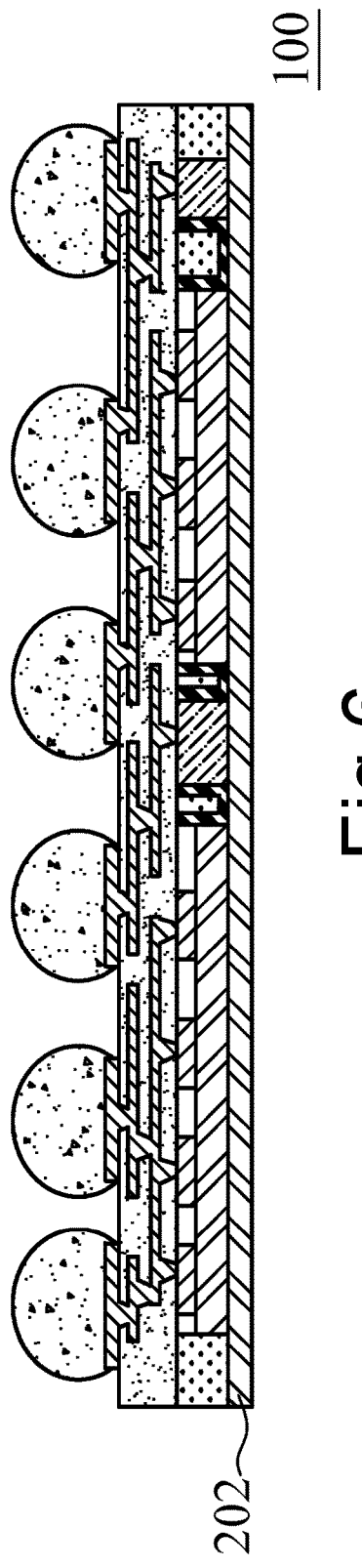
FIG. 6 is a sectional view illustrating the exemplary semiconductor package according to the exemplary embodiment.

FIG. 6 is a sectional view illustrating the exemplary semiconductor package 100 according to the exemplary embodiment. As shown in FIG. 6, by applying a laser beam or a heater to the temporary bonding layer 104, the semiconductor package 100 is debonded from the carrier 102 (shown in FIG. 5).

FIG. 7 is a sectional view illustrating an exemplary semiconductor device 700 according to an exemplary embodiment. As shown in FIG. 7, the semiconductor package 100 is provided over and connected to a printed circuit board 704. An underfill 702 such as epoxy is injected under the semiconductor package 100 after it is soldered to the printed circuit board 704, effectively gluing the semiconductor package 600 to the printed circuit board 704. As such, a semiconductor device 700 is provided.

FIG. 8 is another sectional view illustrating an exemplary semiconductor device 800 according to an exemplary embodiment. Continuing from FIG. 6, as shown in FIG. 8, the semiconductor package 100 is provided over and connected to a printed circuit board 804. An underfill 802 such as epoxy is injected under the semiconductor package 100 after it is soldered to the printed circuit board 804, effectively gluing the semiconductor package 600 to the printed circuit board 804. Additionally, a lithography manufacturability check layer 806 is disposed between the redistribution layer 402 and the printed circuit board 804. A lid (or a backside protection film) 808 is disposed over the semiconductor package 100.

Figure 9:
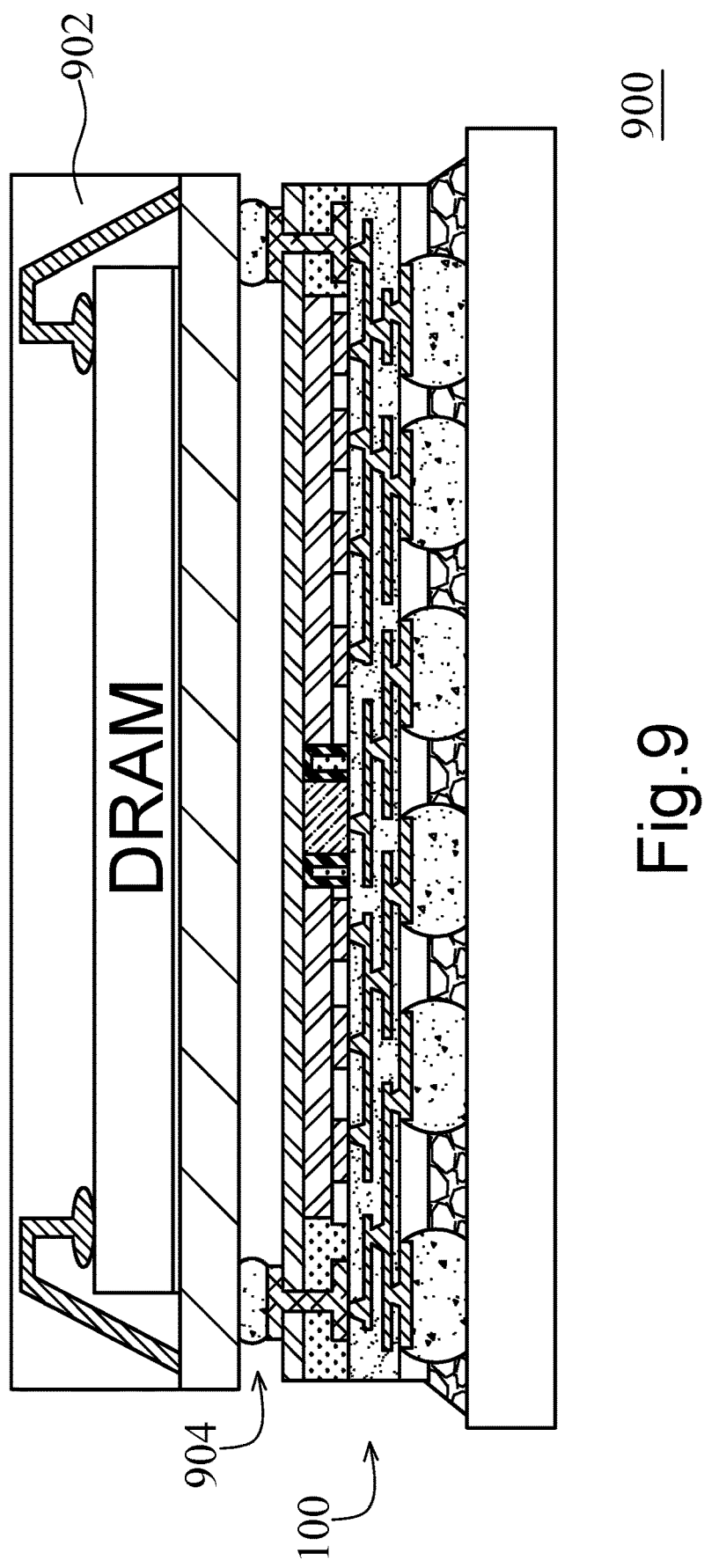
FIG. 9 is another sectional view illustrating an exemplary semiconductor device according to an exemplary embodiment.

FIG. 9 is another sectional view illustrating an exemplary semiconductor device 900 according to an exemplary embodiment. Continuing from FIG. 6, as shown in FIG. 9, a memory 902 is disposed over and connected to the semiconductor package 100 by using a package-on-package structure 904. The rest of the elements in FIG. 9 are similar to FIG. 8 and are not repeated herein.

Figure 10:
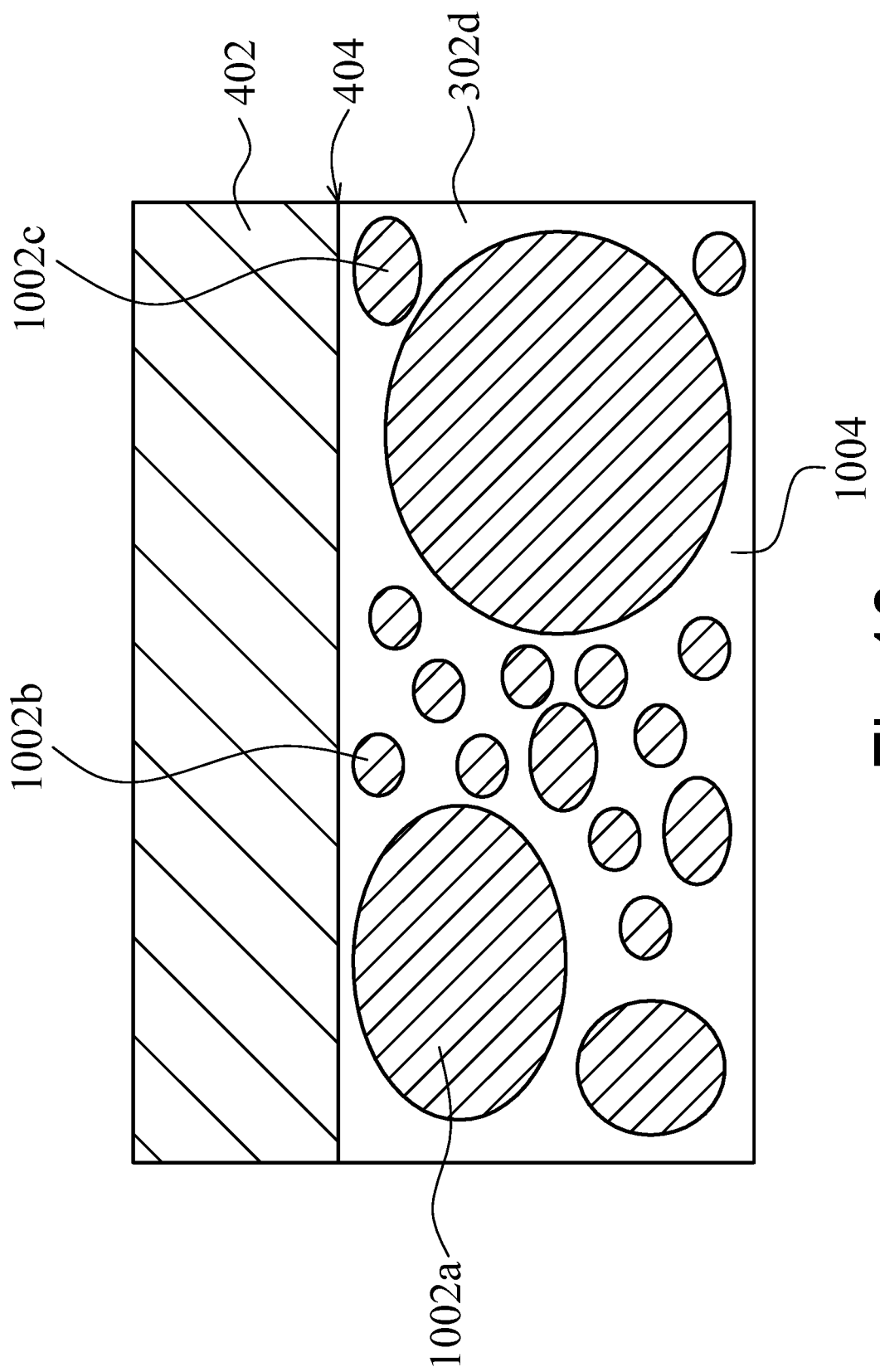
FIG. 10 is a block diagram illustrating a portion of the molding compound in contact with the redistribution layer of the exemplary semiconductor package according to the exemplary embodiment in view of microscope.

FIG. 10 is a block diagram illustrating a portion of the molding compound in contact with the redistribution layer of the exemplary semiconductor package according to the exemplary embodiment in view of microscope. As shown in FIGS. 4 and 10, an exemplary diagram illustrating a photomicrograph of the molding compound 302d is provided. In the embodiment, the molding compound 302d may include epoxy 1004 and glass ball fillers 1002a, 1002b, 1002c, where a substantial number of the glass ball fillers have an intact shape because the direct exposed molding process is performed without an additional grinding process. Otherwise, if a grinding process were performed on the molding compound 302d, the glass ball fillers 1002a, 1002b, 1002c near the junction 404 between the molding compound 302d and the redistribution layer 402 may show a cut-off shape or a cleaved shape. It can be easily observed that any semiconductor device having the semiconductor package abovementioned showing glass ball fillers having an intact shape instead of a cut-off shape or a cleaved shape fall into the scope of the disclosure.

Figure 11:
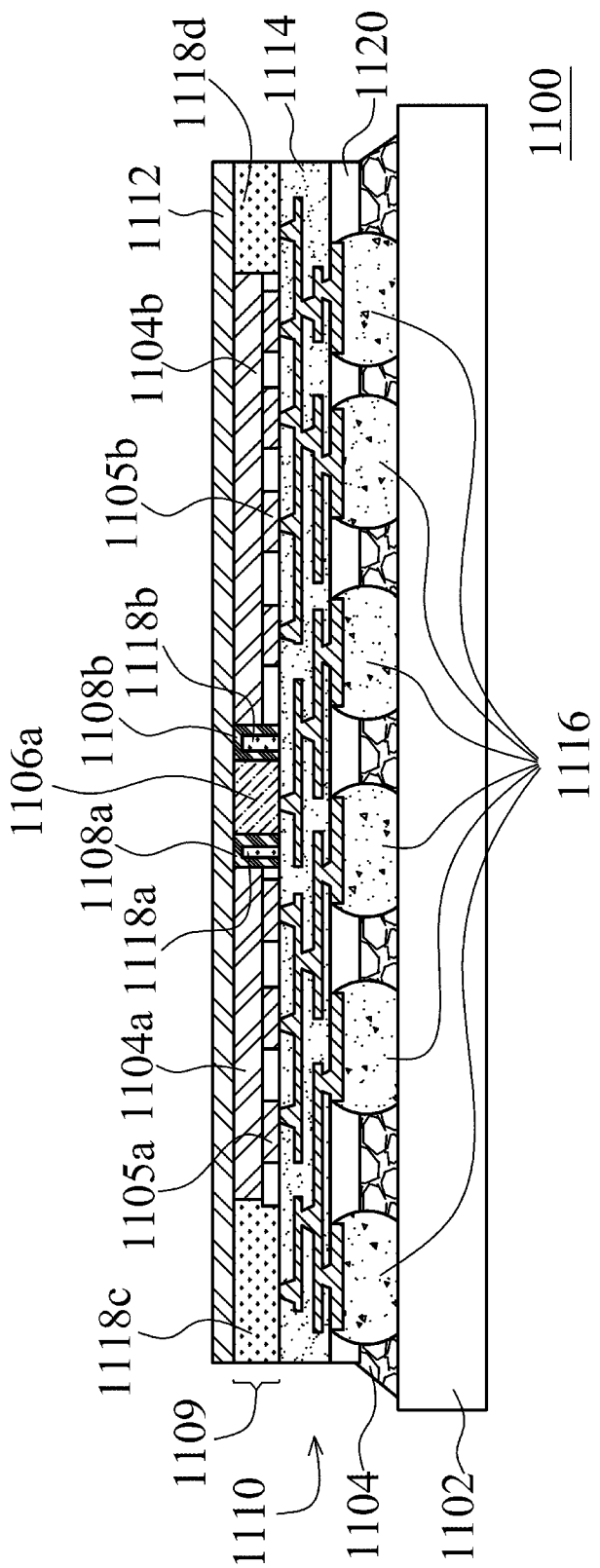
FIG. 11 is a sectional view illustrating an exemplary semiconductor device according to an exemplary embodiment.

FIG. 11 is a sectional view illustrating an exemplary semiconductor device according to an exemplary embodiment. As shown in FIG. 11, a semiconductor device is 1100 is provided. The semiconductor device 1100 includes a semiconductor package 1110, a printed circuit board 1102 and an underfill layer 1104.

The semiconductor package 1110 includes chips 1104a, 1104b and a component 1106a. The component 1106a is adjacent to the chips 1104a, 1104b. The chips 1104a, 1104b and the component 1106a are molded in a same molding body 1109. The component 1106a may be passive components, such as resistor, inductors, or capacitors.

In the embodiment, the semiconductor package 1110 may include the chips 1104a, 1104b, the components 1106a and the molding compounds 1118a-1118d. The component 1106a is adjacent to the chips 1104a, 1104b. The molding compounds 1118a-1118d are disposed between the chips 1104a, 1104b and the components 1106a. The chips 1104a, 1104b, the components 206a and the molding compounds 1118a-1118d form the molding body 1109.

In the exemplary embodiment, the chips 1104a, 1104b respectively include I/Os 1105a, 1105b. Mask layers 1108a, 1108b are provided between the chips 1104a, 1104b and the component 1106a. Molding compounds 1118a, 1118b, 1118c are provided in recesses (or gates) of the mask layers 1108a, 1108b by using a direct expose molding process to form the molding body 1109. Molding compounds 1108c, 1108d are provided between different packages. In the exemplary embodiment, the chips 1104a, 1104b and the component 1106a may be molded in the molding body 1109 by using a direct expose molding process.

In the exemplary embodiment, the semiconductor package 1110 may further include an attach film 1112. The attach film 1112 may be formed of, for example, epoxy or polymer. The width of the component 1106a may be, for example, 100-500 micrometer. The distance between the chips 1104a, 1104b and the component 1106a may be, for example, 50-300 micrometer.

In the exemplary embodiment, the semiconductor package 1110 may further include a redistribution layer (RDL) 1114 connected to the chips 1104a, 1104b and the component 1106a.

In the exemplary embodiment, the semiconductor package 1110 may further include metal bumps 1116 connected to the chips 1104a, 1104b and the component 1106a by the redistribution layer 1114.

In the exemplary embodiment, the semiconductor package 1110 is provided over and connected to a printed circuit board 1102. An underfill 1104 such as epoxy is injected under the semiconductor package 1110 after it is soldered to the printed circuit board 1102, effectively gluing the semiconductor package 1110 to the printed circuit board 1102. Additionally, a lithography manufacturability check layer 1120 is disposed between the redistribution layer 1114 and the printed circuit board 1102.

In the exemplary embodiment, the chips 1104a, 1104b may be at least one of silicon semiconductors or iii-v semiconductors. In the exemplary embodiment, the chips 1104a, 1104b may include a microelectromechanical system (MEMS). In the exemplary embodiment, the chips 1104a, 1104b may be application processors.

In the exemplary embodiment, the molding compounds 1118a-1118d may include epoxy and ball fillers having an intact shape instead of a cleaved shape. In the exemplary embodiment, the component 1106a may be disposed in a fan-out area of the semiconductor package 1110. In the exemplary embodiment, a semiconductor device 1100 may further include a memory disposed over and connected to the semiconductor package 1110 by using a package-on-package structure. In the exemplary embodiment, a semiconductor device 1100 may further include a lid disposed over the semiconductor package 1110.

Figure 12:
FIG. 12 is a flow chart for forming a semiconductor device according to an exemplary embodiment.

FIG. 12 is a flow chart for forming a semiconductor device according to an exemplary embodiment. As shown in FIG. 12, a method 1200 is provided. The method 1200 includes the following operation: molding at least one chip and at least one component in a same molding body (1202).

FIG. 13 is a flow chart for forming a semiconductor device according to an exemplary embodiment. As shown in FIG. 13, a method 1300 is provided. The method 1300 includes the following operations: providing a temporary bonding layer over a carrier (1302); providing the chip and the component over the temporary bonding layer (1304); providing a mask layer between the chip and the component (1306); molding at least one chip and at least one component in a same molding body (1202); providing a molding compound in a recess of the mask layer by using a direct expose molding process to form the molding body (1308); providing a redistribution layer over and connected to the chip and the component (1310); providing a plurality of metal bumps connected to the chip and the component by the redistribution layer (1312); debonding the semiconductor package from the carrier (1314); and providing the semiconductor package over and connected to a printed circuit board (1316).

In the exemplary embodiment, the method 1300 may further include: providing a lithography manufacturability check layer disposed between the redistribution layer and the printed circuit board. In the exemplary embodiment, the method 1300 may further include: providing a memory disposed over and connected to the semiconductor package by using a package-on-package structure. In the exemplary embodiment, the operation 1308 may further include: providing the molding compound by the direct expose molding process without a grinding process so that the molding compound comprises epoxy and ball fillers without a cleaved shape.

According to an exemplary embodiment, a method of forming a semiconductor device is provided. The method includes the following operation: molding at least one chip and at least one component in a same molding body.

According to an exemplary embodiment, a semiconductor device is provided. The semiconductor device includes a semiconductor package, a printed circuit board and an underfill layer. The semiconductor package includes: at least one chip; at least one component adjacent to the at least one chip, wherein the at least one chip and the at least one component are molded in a same molding body; a molding compound disposed between the at least one chip and the at least one component to form the molding body; a redistribution layer connected to the at least one chip and the at least one component; and a plurality of metal bumps connected to the at least one chip and the at least one component by the redistribution layer. The printed circuit board is connected to the semiconductor package by the metal bumps. The underfill layer is disposed between the printed circuit board and the semiconductor package.

According to an exemplary embodiment, a semiconductor package is provided. The semiconductor package includes at least one chip; at least one component adjacent to the at least one chip; and a molding compound disposed between the at least one chip and the at least one component, wherein the at least one chip, the at least one component and the molding compound form a molding body.

This written description uses examples in the disclosure to: disclose the best mode and also to enable a person ordinarily skilled in the art to make and use the disclosure. The patentable scope may include other examples that occur to those skilled in the art.

One skilled in the relevant art upon reading this disclosure will recognize that the various embodiments may be practiced without one or more of the specific details, or with other replacement and/or additional methods, materials, or components. Well-known structures, materials, or operations may not be shown or described in detail to avoid obscuring aspects of various embodiments. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The embodiments of a device or article described herein may be manufactured, used, or shipped in a number of positions and orientations. Persons skilled in the art will recognize various equivalent combinations and substitutions for various components shown in the figures.

What is claimed is:

1. A method comprising:
   forming a semiconductor package comprising:

providing a temporary bonding layer over a carrier;
providing a chip and a passive component over the temporary bonding layer;
providing a mask layer having a recess formed therein between the chip and the passive component, the mask layer being disposed in a same vertical level as the chip and the passive component, the mask layer being a conformal layer;
providing a molding compound in the recess of the mask layer, a thickness of the molding compound being equal to a height of the recess, top surfaces of the mask layer, the molding compound, the chip, and the passive component being at a same level;
providing a redistribution layer over and connected to the chip and the passive component;
providing a plurality of metal bumps connected to the chip and the passive component by the redistribution layer;
after providing the plurality of metal bumps, debonding the semiconductor package from the carrier; and
providing the semiconductor package over and connected to a printed circuit board.

2. The method of claim 1, wherein the mask layer comprises:
a first portion that coats a sidewall of the chip;
a second portion that coats a sidewall of the passive component; and
a third portion that extends from the first portion to the second portion, the third portion being between the chip and the passive component, wherein the first, second, and third portions are connected and form a continuous layer.

3. The method of claim 1 further comprising:
providing a lithography manufacturability check layer disposed between the redistribution layer and the printed circuit board.

4. The method of claim 1 further comprising:
providing a memory disposed over and connected to the semiconductor package by using a package-on-package structure.

5. The method of claim 1 further comprising:
providing a lid disposed over the semiconductor package.

6. The method of claim 1, wherein providing the molding compound in the recess further comprises:
providing the molding compound by a direct expose molding process without a grinding process so that the molding compound comprises epoxy and ball fillers without a cleaved shape.

7. The method of claim 1, wherein the passive component is disposed in a fan-out area of the semiconductor package.

8. The method of claim 1 further comprising:
disposing an attach film over the temporary bonding layer, the chip and passive component being disposed on the attach film.

9. The method of claim 1 further comprising:
forming an underfill layer between the printed circuit board and the semiconductor package, the underfill layer surrounding the plurality of metal bumps.

10. A method comprising:
attaching a chip and a passive component over a carrier, the chip having a first sidewall, the passive component having a second sidewall;
forming a mask layer extending along the first sidewall, along a portion of a surface between the chip and the passive component, and along the second sidewall, the mask layer defining a recess, the mask layer being a conformal layer;
forming a molding compound over the mask layer, the molding compound filling the recess, wherein a topmost surface of the chip is level with a topmost surface of the passive component, a topmost surface of the mask layer, and a topmost surface of the molding compound, and wherein the topmost surface of the mask layer is level with the topmost surface of the molding compound between the chip and the passive component; and
forming a redistribution structure over the chip, the passive component, and the carrier, the redistribution structure comprising one or more conductive layers that are connected to the chip and the passive component, the mask layer and the molding compound contacting the redistribution structure between the chip and the passive component.

11. The method of claim 10, wherein a thickness of the molding compound in the recess has a thickness equal to a height of the recess.

12. The method of claim 10 further comprising:
forming a plurality of conductive connectors on the redistribution structure, the redistribution structure being electrically coupled to the chip and the passive component.

13. The method of claim 12 further comprising:
debonding the carrier from backsides of the chip and the passive component; and
bonding the plurality of conductive connectors to a printed circuit board.

14. The method of claim 13 further comprising:
attaching a lid to the backsides of the chip and the passive component.

15. The method of claim 12 further comprising:
forming a through via in the molding compound adjacent the chip, the through via being electrically coupled to the redistribution structure; and
bonding a memory to the through via, the memory being electrically coupled to the through via.

16. The method of claim 10, wherein the passive component is contacting the molding compound.

17. A method comprising:
disposing backsides of a chip and a passive component on a surface, input/output connectors of the chip facing away from the surface, the chip comprising active devices and the passive component comprising passive devices and being free of active devices;
forming a mask layer having a recess formed therein, the mask layer being disposed between the chip and the passive component, and the chip, the passive component, and the mask layer being disposed at a same vertical level, the mask layer being a conformal layer contacting sidewalls of the chip and the passive component and the surface between the chip and the passive component; and
forming a molding compound disposed in the recess and having a thickness equal to a height of the recess, top surfaces of the molding compound and the mask layer being at a same level;
forming a redistribution structure on the chip and the passive component and over the surface, the redistribution structure comprising one or more conductive layers that are connected to the chip and the passive component, the mask layer and the molding compound contacting the redistribution structure between the chip and the passive component;

forming a plurality of metal bumps on the redistribution structure, the redistribution structure being electrically coupled to the chip and the passive component;

bonding the plurality of metal bumps to a substrate; and forming an underfill layer disposed between the substrate and the redistribution structure, the underfill layer surrounding the plurality of metal bumps.

18. The method of claim 17, wherein the mask layer comprises:
a first portion on a sidewall of the chip;
a second portion on a sidewall of the passive component; and
a third portion that on a portion of the surface on which the chip and the passive component are disposed, wherein the first, second, and third portions are connected and form a continuous layer.

19. The method of claim 17, wherein the mask layer comprises a polymer.

20. The method of claim 17 further comprising:
attaching a lid to backsides of the chip and the passive component.

* * * * *